(12) United States Patent
Ou Yang et al.

(10) Patent No.: US 10,191,121 B2
(45) Date of Patent: Jan. 29, 2019

(54) SYSTEM AND METHOD FOR VOLTAGE REGULATOR SELF-BURN-IN TEST

(71) Applicant: QUANTA COMPUTER INC., Taoyuan (TW)

(72) Inventors: Kuang-Hua Ou Yang, Taoyuan (TW); Kuo-Chan Hsu, Taoyuan (TW); Yun-Teng Shih, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 28 days.

(21) Appl. No.: 15/609,721

(22) Filed: May 31, 2017

(65) Prior Publication Data

US 2018/0348309 A1    Dec. 6, 2018

(51) Int. Cl.
| | |
|---|---|
| *G01R 31/40* | (2014.01) |
| *H03K 17/687* | (2006.01) |
| *H02M 1/088* | (2006.01) |
| *G05B 15/02* | (2006.01) |
| *G01R 31/00* | (2006.01) |
| *H02M 1/00* | (2006.01) |

(52) U.S. Cl.
CPC .......... *G01R 31/40* (2013.01); *G01R 31/003* (2013.01); *G05B 15/02* (2013.01); *H02M 1/088* (2013.01); *H03K 17/6871* (2013.01); *H02M 2001/0009* (2013.01)

(58) Field of Classification Search
CPC ...... G01R 31/003; G05B 15/02; H02M 1/088
See application file for complete search history.

(56) References Cited

U.S. PATENT DOCUMENTS

| | | |
|---|---|---|
| 5,390,129 A | 2/1995 | Rhodes |
| 6,215,324 B1 | 4/2001 | Yoshida |

(Continued)

FOREIGN PATENT DOCUMENTS

| | | |
|---|---|---|
| TW | 448607 B | 8/2001 |
| TW | 201300792 A | 1/2013 |
| TW | 201637514 | 10/2016 |

OTHER PUBLICATIONS

TW Office Action for Application No. 106140265 dated Sep. 18, 2018, w/ First Office Action Summary.

(Continued)

*Primary Examiner* — Jermele M Hollington
*Assistant Examiner* — Alvaro Fortich
(74) *Attorney, Agent, or Firm* — Nixon Peabody LLP; Eduardo J. Quiñones; Zhou Lu

(57) ABSTRACT

The present disclosure provides a system and method enabling a self-burn-in test for a power supply device (PSD) of a server system using a multi-phase scheme. The PSD comprises a power-width modulation (PWM) controller, and a plurality of power stages. Each of the plurality of power stages comprises a driver, a high-side MOSFET, and a low-side MOSFET. In one aspect of the present disclosure, upon receiving a test mode command from a controller of the server system, the PWM controller can send a PWM signal to switch a specific power stage to the On state, and send at least another PWM signal that switches other power stage(s) of the plurality of power stages to the Tri-state. During a subsequent self-burn-in test of the specific power stage, low-side MOSFET(s) of the other power stage(s) can function as a load for the specific power stage.

20 Claims, 10 Drawing Sheets

(56) References Cited

U.S. PATENT DOCUMENTS

| | | |
|---|---|---|
| 8,487,581 B2 | 7/2013 | Tan et al. |
| 2003/0090257 A1 | 5/2003 | Howes |
| 2004/0119449 A1* | 6/2004 | Matley ............... H02M 1/4258 |
| | | 323/234 |
| 2006/0261835 A1 | 11/2006 | Abadeer et al. |
| 2008/0203577 A1* | 8/2008 | Fukamizu .............. H01L 24/05 |
| | | 257/773 |
| 2010/0321065 A1* | 12/2010 | Wada ..................... G11C 19/00 |
| | | 326/93 |
| 2012/0319668 A1 | 12/2012 | Tu et al. |

OTHER PUBLICATIONS

TW Search Report for Application No. 106140265 dated Sep. 18, 2018, w/ First Office Action.

* cited by examiner

SYSTEM AND METHOD FOR VOLTAGE REGULATOR SELF-BURN-IN TEST

FIELD OF THE INVENTION

The disclosure relates generally to a power supply device (PSD) in a computing system.

BACKGROUND

Modern server farms or datacenters typically employ a large number of servers to handle processing needs for a variety of application services. Each server handles various operations and requires a certain level of power consumption to maintain these operations. Some of these operations are "mission critical" operations, interruptions to which may lead to significant security breach or revenue losses for users associated with these operations.

One source of interruptions is failures or faults at PSUs to a server system. A failure or fault in one or more PSUs can force a sudden shutdown of a server system, possibly resulting in data losses or even damages to the server system. In order to test and improve reliability, stability and safety of PSUs, a burn-in test has been used in the production process of PSUs. However, there are many inherent problems associated with using traditional burn-in tests.

SUMMARY

Systems and methods in accordance with various examples of the present disclosure provide a solution to the above-mentioned problems using a multi-phase scheme to achieve a self-burn-in test for a power supply device (PSD) (e.g., a power supply unit (PSU)) of a server system. The PSD comprises a power-width modulation (PWM) controller, and a plurality of power stages. Each of the plurality of power stages comprises a driver, a high-side MOSFET, and a low-side MOSFET. The high-side and low-side MOSFET pair has three levels that include an On state, an Off state, and a Tri-state. In the On state, the high-side MOSFET is turned on while the low-side MOSFET is turned off. In the Off state, the high-side MOSFET is turned off while the low-side MOSFET is turned on. In the Tri-state, the high-side MOSFET is turned off while the low-side MOSFET is also turned off.

In one aspect of the present disclosure, upon receiving a test mode command from a controller of the server system, the PWM controller can send a PWM signal to switch a specific power stage to the On state, and send at least another PWM signal that switches other power stage(s) of the plurality of power stages to the Tri-state. During a subsequent self-burn-in test of the specific power stage, low-side MOSFET(s) of the other power stage(s) can function as a load for the specific power stage.

In some examples, each of the plurality of power stages can further comprise a voltage sensing circuit, a current sensing circuit and a temperature sensor. During a self-burn-in test of the specific power stage, the PWM controller can collect data from the voltage sensing circuit, the current sensing circuit, and the temperature sensor of the specific power stage.

In accordance with one aspect of the present disclosure, a computer-implemented method for enabling a self-burn-in test of a PSD that includes a PWM controller and a plurality of power stages, comprises: sending a first PWM signal to switch a specific power stage of the plurality of power stages to an On state; sending at least one second PWM signal to switch other power stage(s) of the plurality of power stages to a Tri-state, wherein the other power stage(s) functions as a load during a time period that the specific power stage is in the On state; and collecting output voltage, output current and temperature data from the specific power stage.

In some examples, the computer-implemented method for enabling the self-burn-in test of the PSD further comprises: in response to determining that any of the data fails a predetermined criterion (e.g., an output voltage being too high or too low, an output current being too high or too low, and a temperature being too high), generating a warning signal. In an event that the data has passed the predetermined criterion, the computer-implemented method for enabling the self-burn-in test may further comprise: determining that at least one additional power stage of the PSD is still to be tested; and sending a third PWM signal to switch one of the at least one additional power stage to the On state and sending at least one fourth PWM signal to switch remaining power stage(s) of the plurality of power stages to the Tri-state.

In some examples, the self-burn-in test stops in response to determining any of the data from a particular power stage fails a predetermined criterion and generating a warning signal regarding the particular power stage. In some other examples, the self-burn-in test can move on to a subsequent power stage in response to determining any of the data from a particular power stage fails a predetermined criterion and generating a warning signal regarding the particular power stage.

In some examples, a self-burn-in test of a PSD can comprise 8 phases. The self-burn-in test can be further extended to 8n phases (e.g., 16 phases) if n power stages are tested in parallel.

In accordance with another aspect of the present disclosure, a computer-implemented method for enabling a self-burn-in test of a PSD that includes a PWM controller and a plurality of power stages, comprises: sending at least two first PWM signals to substantially simultaneously switch at least two power stages of the plurality of power stages to an On state; sending at least two second PWM signals to substantially simultaneously switch other power stages of the plurality of power stages to a Tri-state, wherein the other power stages function as a load during a time period that the at least two power stages are in the On state; and collecting voltage, current and temperature data from the at least two power stages. In some examples, the computer-implemented method for enabling the self-burn-in test of the PSD further comprises: in response to determining that any of the data has failed a predetermined criterion, generating a warning signal. In an event that the data have passed the predetermined criterion, the computer-implemented method for enabling the self-burn-in test may further comprise: determining that at least two additional power stages of the PSD are still to be tested; and sending at least two third PWM signals to substantially simultaneously switch the at least two additional power stages to the On state and sending at least two fourth PWM signals to substantially simultaneously switch remaining power stage(s) of the plurality of power stages to the Tri-state.

In accordance with another aspect of the present disclosure, a non-transitory computer-readable storage medium storing instructions is provided, the instructions when executed by a processor causing the processor to perform operations including: sending a first PWM signal to switch a specific power stage of a plurality of power stages of a PSD to an On state; sending at least one second PWM signal to switch other power stage(s) of the plurality of power stages to a Tri-state, wherein the other power stage(s) functions as a load during a time period that the specific power stage is in the On state; and collecting output voltage, current and temperature data from the specific power stage.

In accordance with another aspect of the present disclosure, a non-transitory computer-readable storage medium storing instructions is provided, the instructions when executed by a processor causing the processor to perform operations including: sending at least two first PWM signals to substantially simultaneously switch at least two power stages of a plurality of power stages of a PSD to an On state; sending at least two second PWM signals to substantially simultaneously switch other power stages of the plurality of power stages to a Tri-state, wherein the other power stages function as a load during a time period that the at least two power stages are in the On state; and collecting voltage, current and temperature data from the at least two power stages.

According to some configurations, a controller of the server system is a baseboard management controller (BMC). A storage device on the server system can be configured to be accessed by the controller and a central processing unit (CPU) on the server system. The storage device can be any storage medium configured to store program instructions or data for a period of time. It can be a shared memory between a service controller and the CPU. According to some examples, the storage device can be a flash drive, a random access memory (RAM), a non-volatile random-access memory (NVRAM), a read-only memory (ROM), an electrically erasable programmable read-only memory (EEPROM), or a mailbox register.

Although many of the examples herein are described with reference to utilizing a specific controller on a node, it should be understood that these are only examples and the present disclosure is not limited in this regard. Rather, any service controller that is independent from the main CPU can be utilized to perform a self-burn-in test of a PSD.

Additional features and advantages of the disclosure will be set forth in the description which follows, and, in part, will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only example aspects of the disclosure and are not therefore to be considered to be limiting of its scope, the principles herein are described and explained with additional specificity and detail through the use of the accompanying drawings in which.

DETAILED DESCRIPTION

Various examples of the present disclosure provide systems and methods of enabling a self-burn-in test for a power supply device (PSD) (e.g., a power supply unit (PSU)) of a server system using a multi-phase scheme. The PSD comprises a power-width modulation (PWM) controller, and a plurality of power stages. Each of the plurality of power stages comprises a driver, a high-side MOSFET, and a low-side MOSFET. In one aspect of the present disclosure, upon receiving a test mode command from a controller of the server system, the PWM controller can send a PWM signal to switch a specific power stage to the On state, and send at least another PWM signal that switches other power stage(s) of the plurality of power stages to the Tri-state. During a subsequent self-burn-in test of the specific power stage, low-side MOSFET(s) of the other power stage(s) can function as a load for the specific power stage.

Figure 1A:
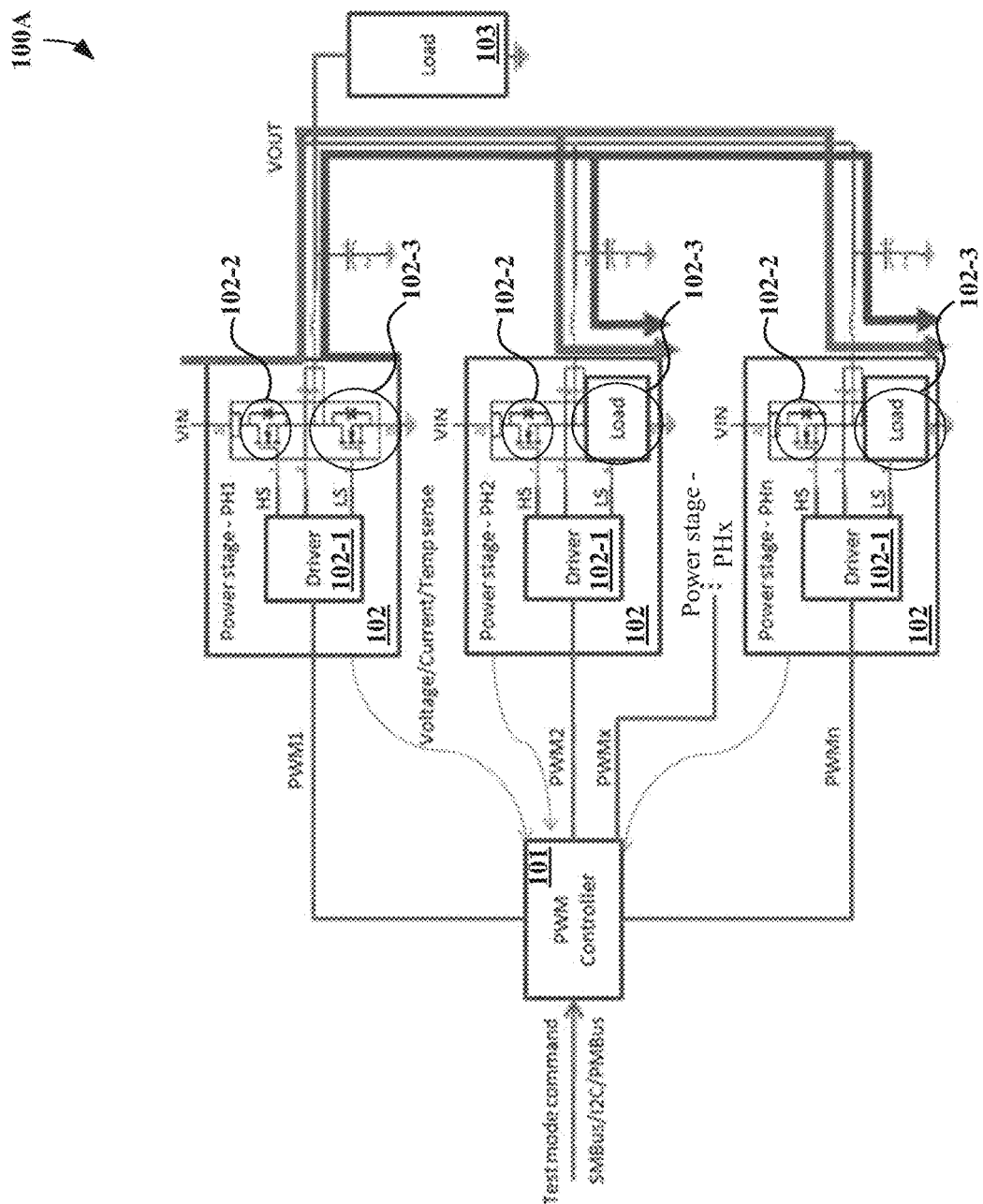
FIG. 1A is a schematic block diagram illustrating an exemplary system enabling a self-burn-in test for a power supply device (PSD), in accordance with an implementation of the present disclosure.

FIG. 1A is a schematic block diagram illustrating an exemplary system 100A enabling multi-phase testing of a PSD of a server system, in accordance with an implementation of the present disclosure. In this example, the PSD comprises a PWM controller 101 and a plurality of power stages 102. An output of the plurality of power stages 102 is coupled to a load 103. The PWM controller 101 can receive a test mode command from a controller (e.g., a baseboard management controller (BMC)) of the server system via system management bus (SMBus)/inter-integrated circuit ($I^2C$) bus/power management bus (PMBus) to enable a self-burn-in test of the plurality of power stages 102. Each of the plurality of power stages 102 comprises a driver 102-1, a high-side MOSFET 102-2 and a low-side MOSFET 102-3.

Upon receiving the test mode command from the controller of the server system, the PWM controller can send a PWM signal (e.g., PWM1) to a specific power stage (e.g., power stage PH1) to switch the specific power stage to an On state, while sending PWM signals (e.g., PWM2, PWMx, and PWMn) to switch other power stages (e.g., power stage PH2, power stage PHx and power stage PHn) to a Tri-state.

During a subsequent self-burn-in test of the specific power stage, the specific power stage (e.g., power stage PH1) is in the On state, during which a high-side MOSFET (e.g., PH1 HS) of the specific power stage is switched on and low-side MOSFET (e.g., PH1 LS) of the specific power stage is switched off. Other power stages (e.g., power stage PH2, power stage PHx and power stage PHn) are switched to the Tri-state, during which both high-side MOSFETs (e.g., PH2 HS and PHn HS) and low-side MOSFETs (e.g., PH2 LS and PHn LS) of the other power stages (e.g., power stage PH2 and power stage PHn) are turned off, respectively.

Effectively, low-side MOSFETs (e.g., PH2 LS and PHn LS) of the other power stages (e.g., power stage PH2 and power stage PHn) all function as a load for the specific power stage (e.g., power stage PH1).

Each of the plurality of power stages 102 comprises at least one of a voltage sensing circuit, a current sensing circuit and a temperature sensor. During a self-burn-in test of a specific power stage, the PWM controller 101 can collect data from the voltage sensing circuit, the current sensing, and/or the temperature sensor of the specific power stage. In response to determining that any of the data fails a predetermined criterion (e.g., an output voltage being too high or too low, an output current being too high or too low, and a temperature being too high), the controller of the server system or the PWM controller can generate a warning signal indicating that the specific power stage or the PSD has failed the self-burn-in test.

Figure 1B:
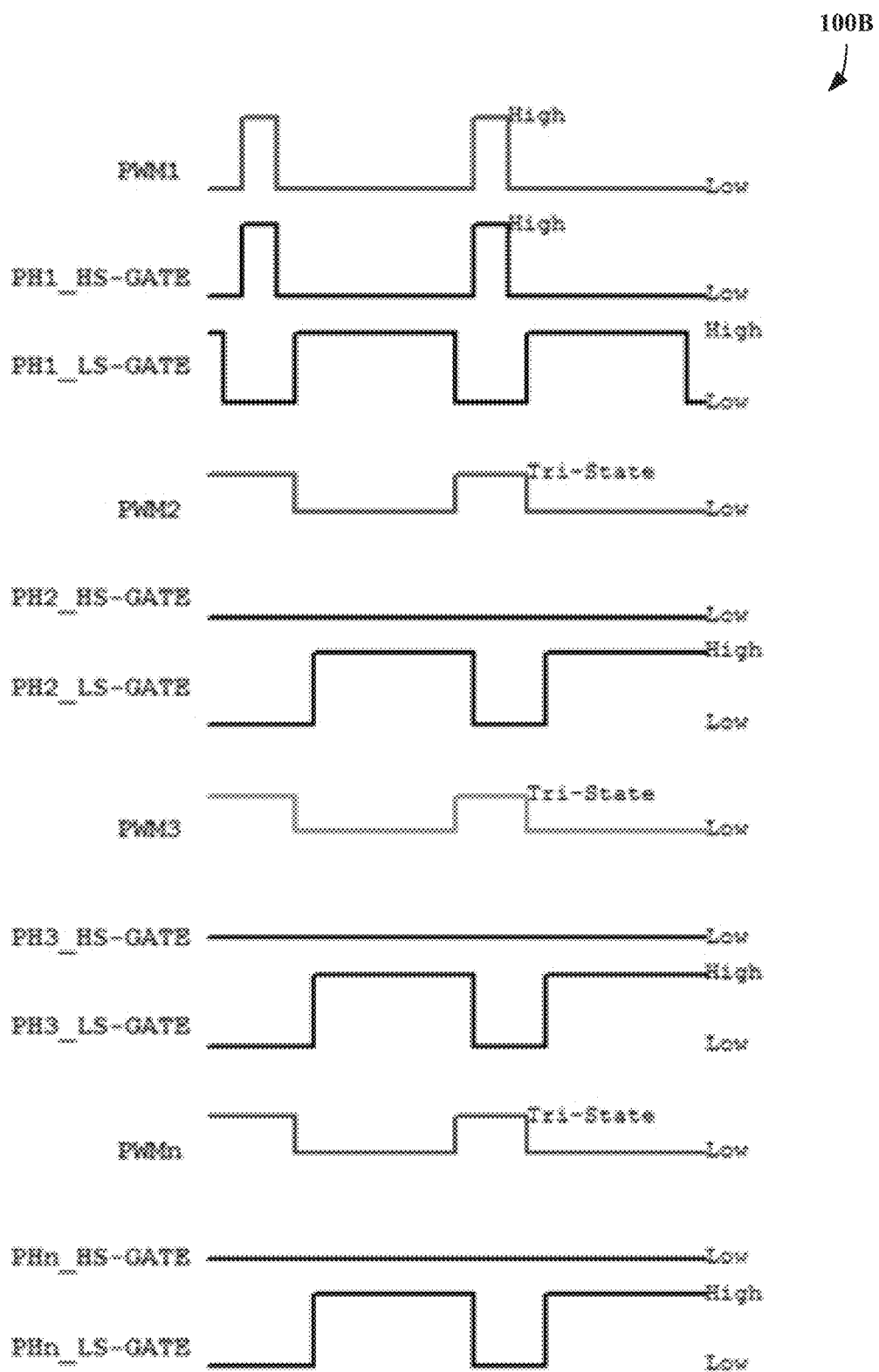
FIGS. 1B-1E are schematic block diagrams illustrating timing charts during a self-burn-in test of a PSD in accordance with an implementation of the present disclosure.

Timing charts during the self-burn-in test of the PSD in FIG. 1A are illustrated in FIGS. 1B-1E. In FIG. 1B, upon receiving the PWM signal PWM1, the high-side MOSFET PH1_HS is switched on while the low-side MOSFET PH1_LS is switched off. Upon receiving the PWM signals PWM2, PWM3 and PWMn, the high-side MOSFETs PH2_HS, PH3_HS and PHn_HS are turned off while the low-side MOSFETs PH2_LS, PH3_LS and PHn_LS are also turned off. As a result, the low-side MOSFETs PH2_LS, PH3_LS and PHn_LS function as a load for the high-side MOSFET PH1_HS.

Figure 1C:
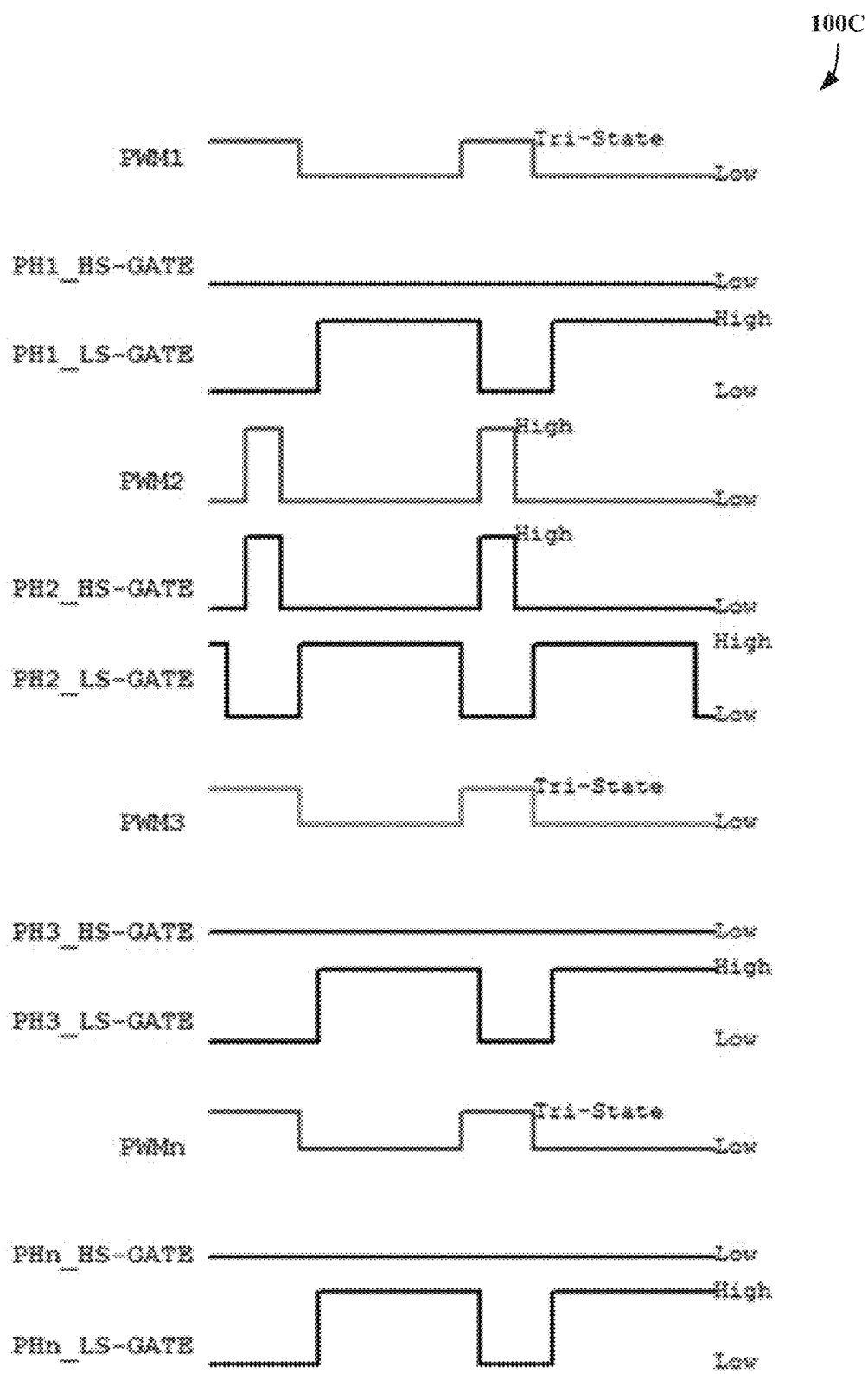

Similarly, in FIG. 1C, upon receiving the PWM signal PWM2, the high-side MOSFET PH2_HS is switched on while the low-side MOSFET PH2_LS is switched off. Upon receiving the PWM signals PWM1, PWM3 and PWMn, the high-side MOSFETs PH1_HS, PH3_HS and PHn_HS are turned off while the low-side MOSFETs PH1_LS, PH3_LS and PHn_LS are also turned off.

Figure 1D:
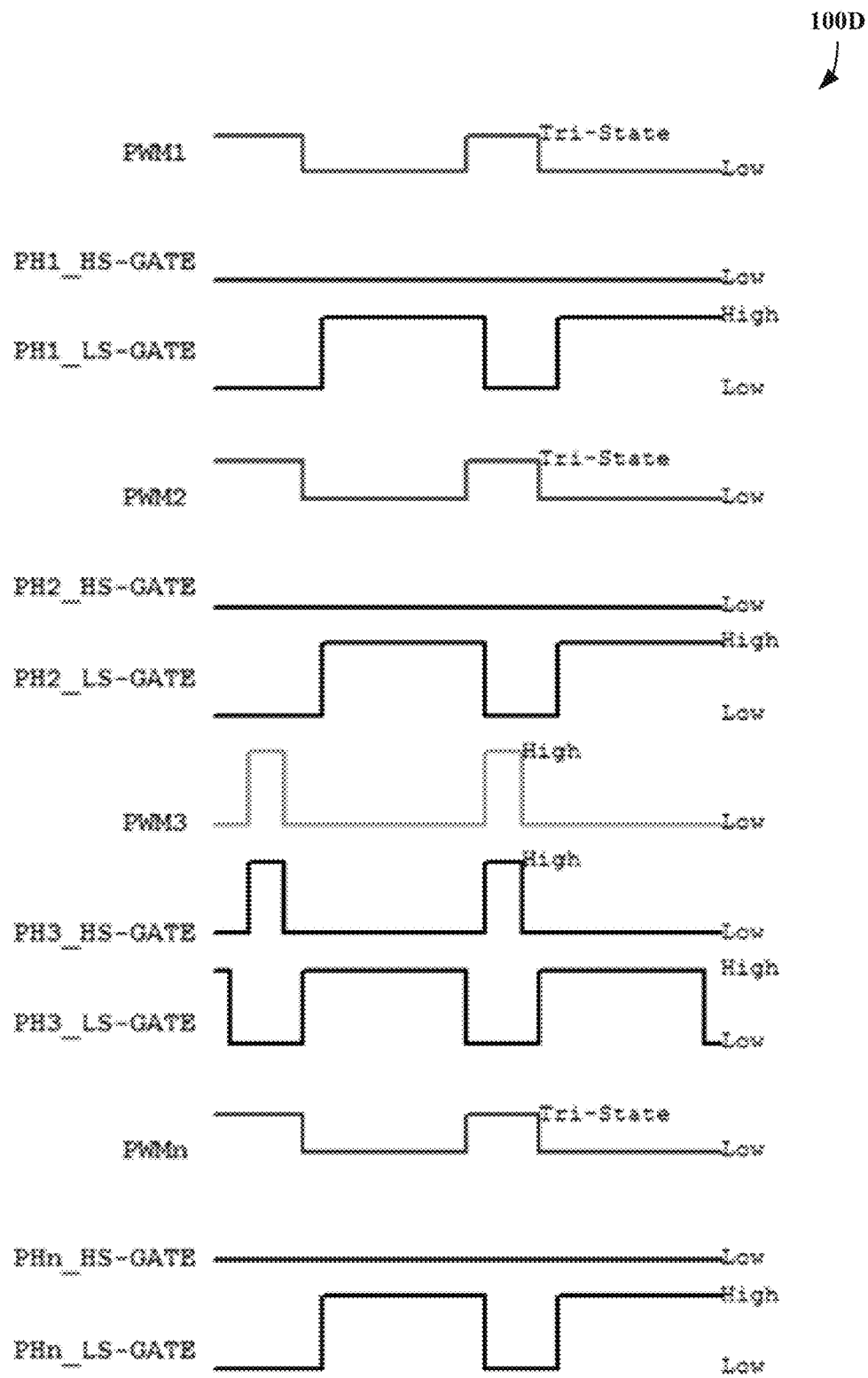
Figure 1E:
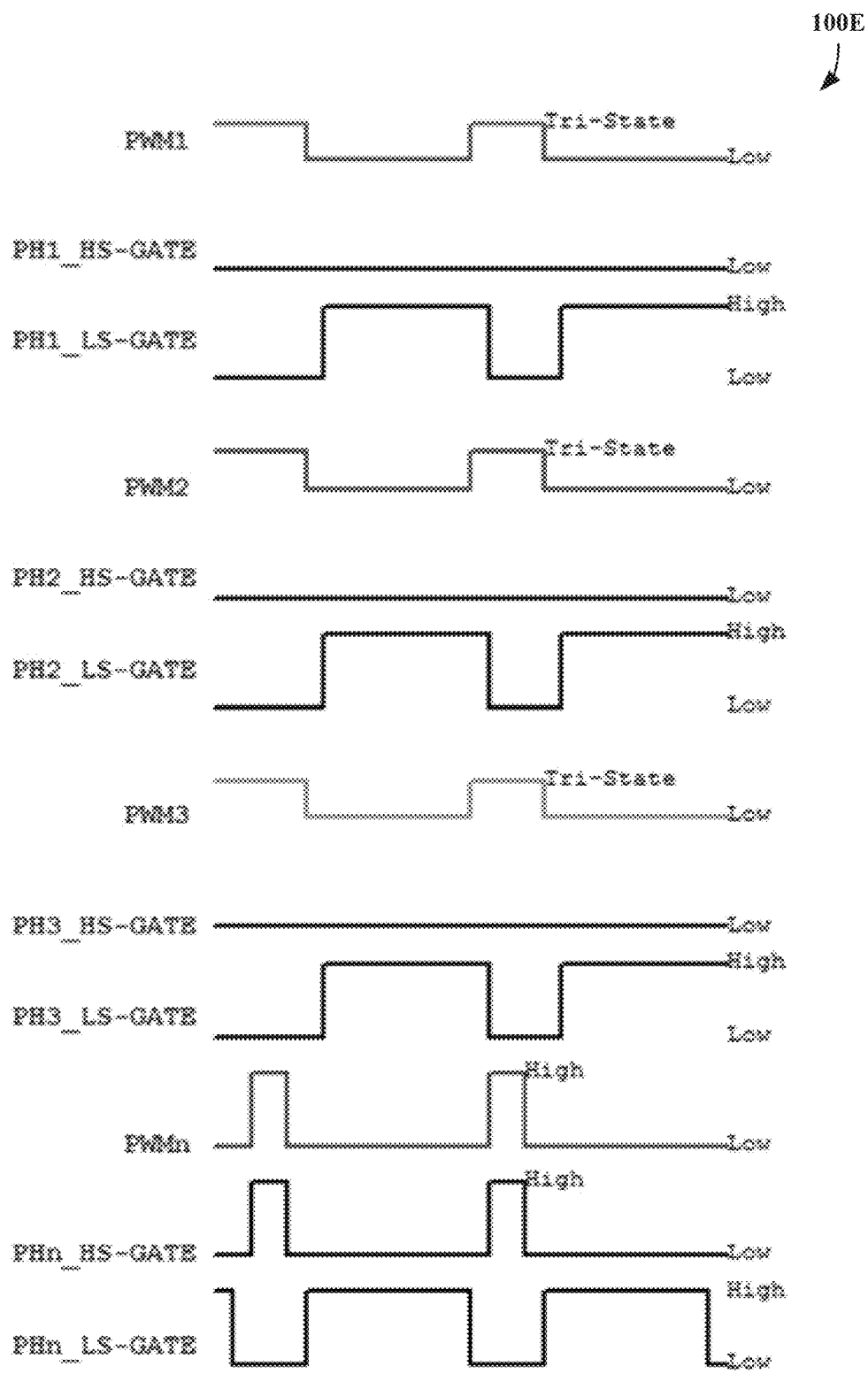

In FIG. 1D, upon receiving the PWM signal PWM3, the high-side MOSFET PH3_HS is switched on while the low-side MOSFET PH3_LS is switched off. Upon receiving the PWM signals PWM1, PWM2 and PWMn, the high-side MOSFETs PH1_HS, PH2_HS and PHn_HS are turned off while the low-side MOSFETs PH1_LS, PH2_LS and PHn_LS are also turned off. In FIG. 1E, upon receiving the PWM signal PWMn, the high-side MOSFET PHn_HS is switched on while the low-side MOSFET PHn_LS is switched off. Upon receiving the PWM signals PWM1, PWM2 and PWM3, the high-side MOSFETs PH1_HS, PH2_HS and PH3_HS are turned off while the low-side MOSFETs PH1_LS, PH2_LS and PH3_LS are also turned off.

In accordance with another aspect of the present disclosure, upon receiving a test mode command from the controller of the server system, the PWM controller 101 can send at least two first PWM signals to substantially simultaneously switch at least two power stages of the plurality of power stages 102 to an On state, while sending at least two second PWM signals to substantially simultaneously switch at least two other power stages of the plurality of power stages 102 to a Tri-state. Effectively, corresponding low-side MOSFETs of the at least two other power stages 102 function as a load for the at least two power stages.

The PWM controller 101 can collect data from a voltage sensing circuit, a current sensing, and/or a temperature sensor of each of the at least two power stages. In response to determining that any of the data fails a predetermined criterion, the controller of the server system or the PWM controller can generate a warning signal indicating that the at least two power stages or the PSD have/has failed the self-burn-in test.

Overall, the present disclosure is advantageous over conventional solutions. Conventional systems cannot really achieve a full load test for MOSFET components when running self-burn-in tests or at least have to use a high-power resistor as a dummy load. However, the high-power resistor in conventional systems has a large size and cannot accurately match required load current.

Figure 1F:
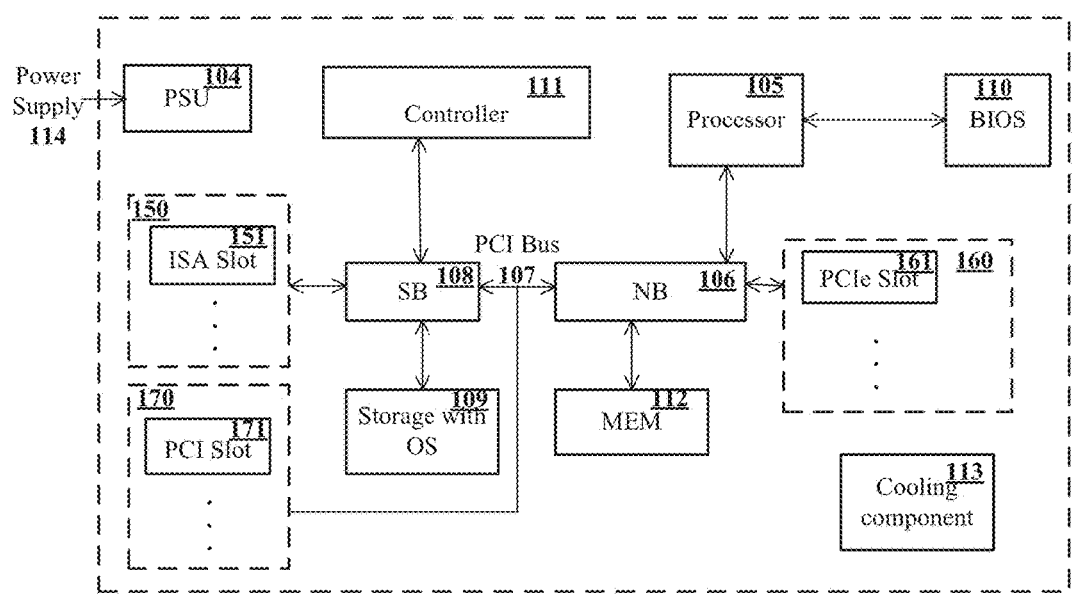
FIG. 1F is a schematic block diagram illustrating an exemplary system enabling a self-burn-in test for a PSU of a server system in a datacenter, in accordance with an implementation of the present disclosure.

FIG. 1F is a schematic block diagram illustrating an exemplary system enabling a self-burn-in test for a PSU 104 of a server system 100F in a datacenter, in accordance with an implementation of the present disclosure. In this example, the server system 100F includes at least one microprocessor or processor 105, one or more cooling components 113, a main memory (MEM) 112, at least one power supply unit (PSU) 104 that receives an AC power from an AC power supply 114 and supply power to various components of the server system 100F, such as the processor 105, north bridge (NB) logic 106, PCIe slots 160, south bridge (SB) logic 108, storage device 109, ISA slots 150, PCI slots 170, and a controller 111. After being powered on, the server system 100F is configured to load a software application from memory, computer storage device, or an external storage device to perform various operations. The storage device 109 is structured into logical blocks that are available to an operating system and applications of the server system 100F and configured to retain server data even when the server system 100F is powered off.

The memory 112 can be coupled to the processor 105 via the NB logic 106. The memory 112 may include, but is not limited to, dynamic random access memory (DRAM), double data rate DRAM (DDR DRAM), static RAM (SRAM), or other types of suitable memory. The memory 112 can be configured to store BIOS data of the server system 100F. In some configurations, BIOS data can be stored on the storage device 109.

The BIOS 110 can be any program instructions or firmware configured to initiate and identify various components of the server systems 100F. The BIOS 110 is an important system component that is responsible for initializing and testing hardware components of the server system 100F. The BIOS can provide an abstraction layer for the hardware components thereby providing a consistent way for applications and operating systems to interact with a peripheral device such as a keyboard, a display, and other input/output devices.

In some configurations, the BIOS 110 can run a system check prior to booting up an operating system (OS), e.g., the Microsoft Windows® OS, the Linux® OS, or any operating system, on a corresponding server system. The system check is a diagnostic system examination executed during initialization of the corresponding server system. An example of system check includes a Power-On Self-Test (POST). The BIOS can handle major functions of POST and may offload some duties to other programs designed to initialize specific peripheral devices (e.g., video and small computer system interface (SCSI) initialization). The major functions of POST may include: verifying CPU registers and the integrity of the BIOS code, checking basic components, examining system main memory, and passing control to other specialized BIOS extension. In some configurations, the BIOS may also handle additional POST's functions including: discovering, initializing, and cataloging all system buses and devices, providing a user interface for updating system's configuration, and constructing a system environment required by the operating system.

In system 100F, the storage device 109 can be any storage medium configured to store program instructions or data for a period of time. The storage device can be a shared memory between the controller 111 and processor 105. In some configurations, the storage device can be an independent storage device. The storage device can be a flash drive, a random access memory (RAM), a non-volatile random-access memory (NVRAM), a read-only memory, or an electrically erasable programmable read-only memory (EEPROM). The storage device is configured to store the system configurations such as BIOS data.

The processor 105 can be a central processing unit (CPU) configured to execute program instructions for specific functions. For example, during a booting process, the processor can access BIOS data stored in the storage device 109 and execute the BIOS 110 to initialize the server system 100F. After the booting process, the processor 105 can execute an operating system in order to perform and manage specific tasks for the server system 100F.

In some configurations, the processor 105 can be multi-core processors, each of which is coupled together through a CPU bus connected to the NB logic 106. In some configurations, the NB logic 106 can be integrated into the processor 105. The NB logic 106 can also be connected to a plurality of peripheral component interconnect express (PCIe) slots 160 and an SB logic 108 (optional). The plurality of PCIe slots 160 can be used for connections and buses such as PCI Express x1, USB 2.0, SMBus, SIM card, future extension for another PCIe lane, 1.5 V and 3.3 V power, and wires to diagnostics LEDs on the server system 100F's chassis.

In system 100F, the NB logic 106 and the SB logic 108 are connected by a peripheral component interconnect (PCI) Bus 107. The PCI Bus 107 can support function on the processor 105 but in a standardized format that is independent of any of the processor 105's native buses. The PCI Bus 107 can be further connected to a plurality of PCI slots 170 (e.g., a PCI slot 171). Devices connect to the PCI Bus 107 may appear to a bus controller (not shown) to be connected directly to a CPU bus, assigned addresses in the processor 105's address space, and synchronized to a single bus clock. PCI cards that can be used in the plurality of PCI slots 170 include, but are not limited to, network interface cards (NICs), sound cards, modems, TV tuner cards, disk controllers, video cards, small computer system interface (SCSI) adapters, and personal computer memory card international association (PCMCIA) cards.

The SB logic 108 can couple the PCI Bus 107 to a plurality of expansion cards or ISA slots 150 (e.g., an ISA slot 151) via an expansion bus. The expansion bus can be a bus used for communications between the SB logic 108 and peripheral devices, and may include, but is not limited to, an industry standard architecture (ISA) bus, PC/104 bus, low pin count bus, extended ISA (EISA) bus, universal serial bus (USB), integrated drive electronics (IDE) bus, or any other suitable bus that can be used for data communications for peripheral devices.

In system 100F, the SB logic 108 is further coupled to the controller 111 that is connected to the at least one PSU 104. In some implementations, the controller 111 can be a baseboard management controller (BMC), rack management controller (RMC), or other types of service controllers that are independent from a main central processing unit (e.g., the processor 105) can be used to perform functions disclosed herein.

In some configurations, the controller 111 is configured to control operations of the at least one PSU 104 and/or other applicable operations. The controller 111 can communicate with the at least PSU 104 via a SMBus, I2C, or PMBus. Whenever a self-burn-in test is needed, the controller 111 can send a test mode command to the at least one PSU 104 to initiate the self-burn-in test.

In some configurations, the controller 111 can communicate with the processor 105 and the storage device 109 via Intelligent Platform Management Interface (IPMI) messages using Intelligent Platform Management Bus/Bridge (IPMB). IPMB is an enhanced implementation of I$^2$C bus and is a message-based, hardware-level basic interface specification.

In some implementations, the controller 111 can receive and analysis voltage, current and temperature data collected by at least one PWM controller of the at least one PSU 104. In response to determining that any of the data fails a predetermined criterion (e.g., an output voltage being too high or too low, an output current being too high or too low, and a temperature being too high), the controller 111 can generate a warning signal indicating that the at least one PSU 104 has failed the self-burn-in test.

In some implementations, the controller 111 may be configured to monitor processing demands, and components and/or connection status of the server system 100F. Based at least upon the processing demands, the controller 111 can determine a suitable date and time to initiate a self-burn-in test for the at least one PSU 104.

Although only certain components are shown within the exemplary systems 100A and 100F in FIGS. 1A and 1F, respectively, various types of electronic or computing components that are capable of processing or storing data, or receiving or transmitting signals, can also be included in the exemplary systems 100A and 100F. Further, the electronic or computing components in the exemplary systems 100A and 100F can be configured to execute various types of application and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for the exemplary systems 100A and 100F, a variety of networking and messaging protocols can be used, including but not limited to TCP/IP, open systems interconnection (OSI), file transfer protocol (FTP), universal plug and play (UpnP), network file system (NFS), common internet file system (CIFS), AppleTalk etc. As would be appreciated by those skilled in the art, the exemplary systems 100A and 100F illustrated in FIGS. 1A and 1F are used for purposes of explanation. Therefore, a network system can be implemented with many variations, as appropriate, yet still provide a configuration of network platform in accordance with various examples of the present disclosure.

In exemplary configurations of FIGS. 1A and 1F, the exemplary systems 100A and 100F can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art. Various other elements and/or combinations are possible as well within the scope of various examples.

The above discussion is meant to be illustrative of the principles and various examples of the present disclosure. Numerous variations and modifications will become apparent once the above disclosure is fully appreciated.

Figure 2A:
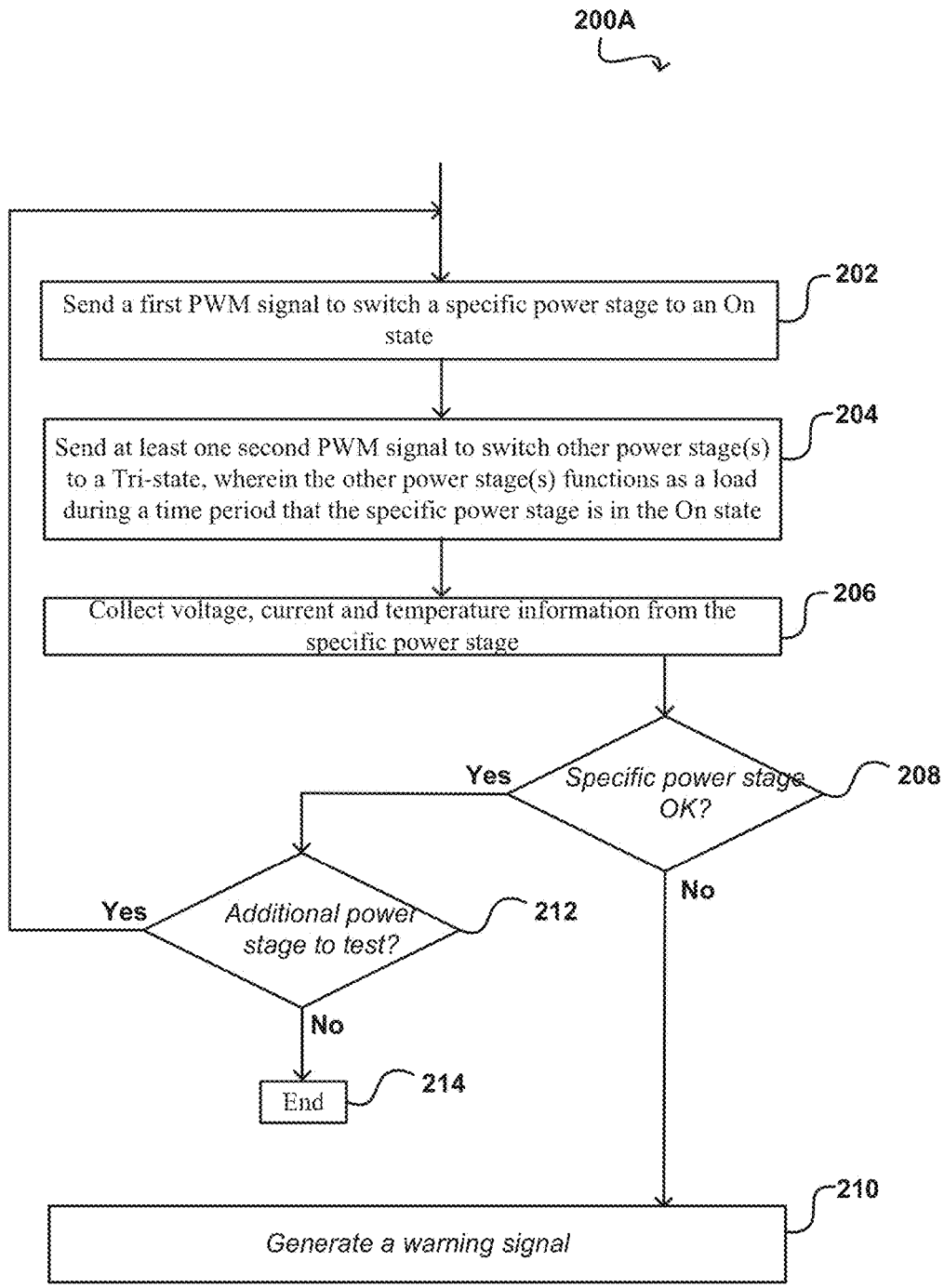
FIGS. 2A-2B are exemplary methods for enabling a self-burn-in test of a PSD in accordance with an implementation of the present disclosure.

FIG. 2A illustrates an exemplary method 200A for enabling a self-burn-in test of a PSD that comprises a PWM controller and a plurality of power stages, in accordance with an implementation of the present disclosure. It should be understood that the exemplary method 200A is presented solely for illustrative purposes and that in other methods in accordance with the present disclosure can include additional, fewer, or alternative steps performed in similar or alternative orders, or in parallel. The exemplary method 200A starts with sending a first PWM signal to switch a specific power stage of the plurality of power stages to an On state, as illustrated in FIGS. 1A-1F. In some examples, a PWM controller of the PSD can send the PWM signal upon receiving a test mode command from a controller of a server system. The PWM controller can receive the test mode command via a SMBus, I$^2$C bus, or PMBus.

At step 204, the PWM controller can send at least one second PWM signal to switch other power stage(s) of the plurality of power stages to a Tri-state, as illustrated in FIGS. 1A-1F. While the specific power stage is in the On state, corresponding low-side MOSFET(s) of the other power stage(s) functions as a load for the specific power stage.

At step 206, the PWM controller can collect output voltage, output current and temperature data from the specific power stage, as illustrated in FIGS. 1A and 1F. At step 208, the PWM controller or the controller of the server system can determine whether any of the data fails a predetermined criterion, as illustrated in FIGS. 1A and 1F. The predetermined criterion can include, but is not limited to, an output voltage of the specific power stage being too high or too low, an output current of the specific power stage being too high or too low, and a temperature of the specific power stage being too high.

At step 210, in an event that the data has failed the predetermined criterion, the PWM controller or the controller of the server system can generate a warning signal indicating that the specific power stage or the PSD has failed. At step 212, in an event that the data has passed the predetermined criterion, the PWM controller can determine whether at least one additional power stage of the PSD is still to be tested.

In an event that at least one additional power stage of the PSD is still to be tested, the PWM controller or the controller of the server system can send a third PWM signal to switch one of the at least one additional power stage to the On state and sending at least one fourth PWM signal to switch remaining power stage(s) of the plurality of power stages to the Tri-state. The computer-implemented method for enabling the self-burn-in test of the PSD goes back to step 202. In an event that all power stages of the plurality of power stages have been tested, the computer-implemented method ends at step 214.

Figure 2B:
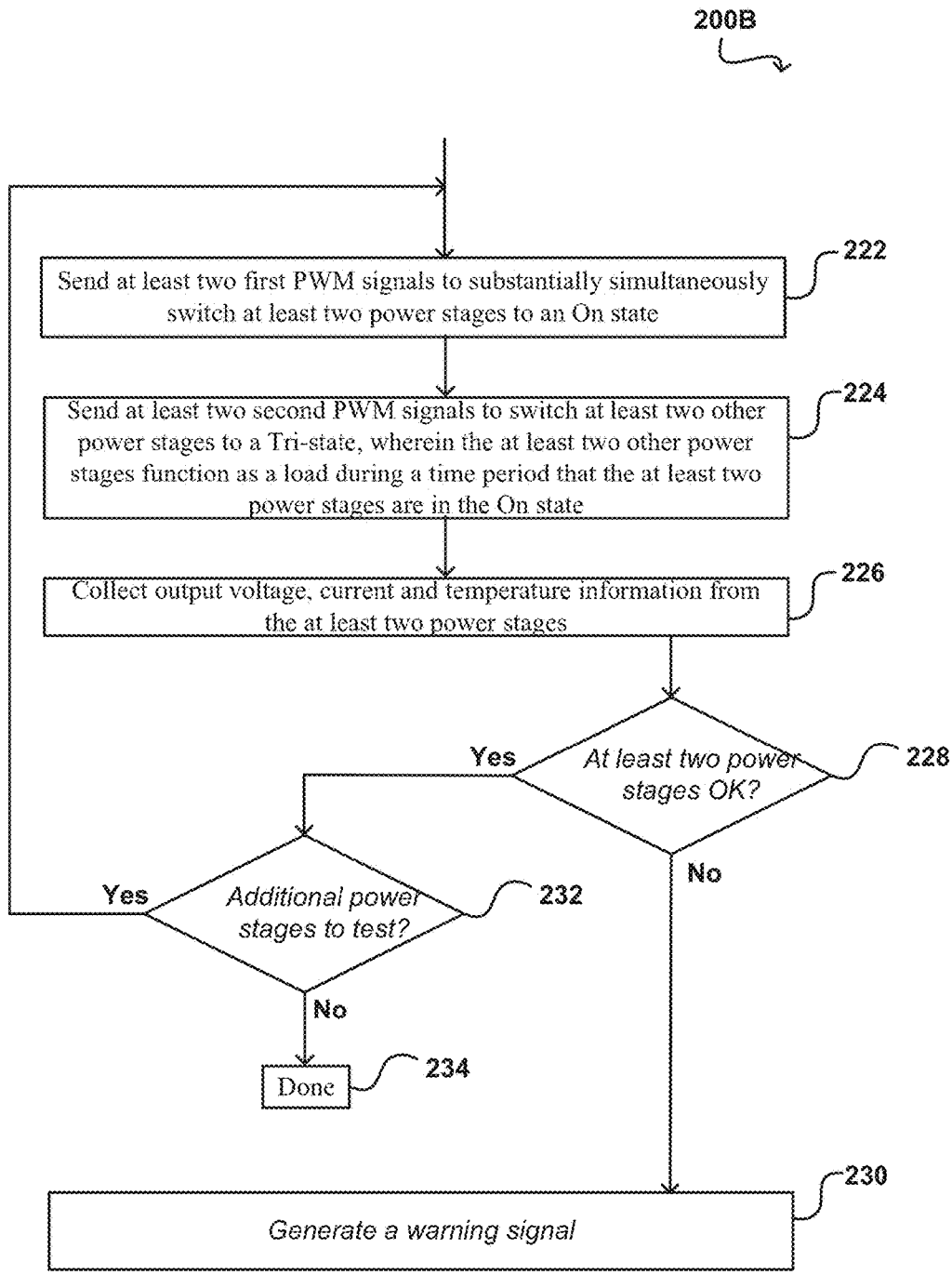

FIG. 2B illustrates an exemplary method 200B for enabling a self-burn-in test of a PSD that comprises a PWM controller and a plurality of power stages, in accordance with an implementation of the present disclosure. At step 222, the PWM controller can send at least two first PWM signals to substantially simultaneously switch at least two power stages of the plurality of power stages to an On state, as illustrated in FIGS. 1A and 1F. In some examples, the PWM controller can send the at least two first PWM signals upon receiving a test mode command from a controller of a server system.

At step 224, the PWM controller can send at least two second PWM signals to switch other power stages of the plurality of power stages to a Tri-state, as illustrated in FIGS. 1A and 1F. While the at least two power stages are in the On state, corresponding low-side MOSFETs of the other power stages function as a load for the at least two power stages.

At step 226, the PWM controller can collection output voltage, output current and temperature data from the at least two power stages, as illustrated in FIGS. 1A and 1F. At step 228, the PWM controller or the controller of the server system can determine whether any of the data fails a predetermined criterion, as illustrated in FIGS. 1A and 1F.

At step 230, in an event that the data has failed the predetermined criterion, the PWM controller or the controller of the server system can generate a warning signal indicating that the at least two power stages or the PSD have failed the self-burn-in test. At step 232, in an event that the data has passed the predetermined criterion, the PWM controller can determine whether at least two additional power stages of the PSD is still to be tested.

In an event that at least two additional power stages of the PSD are still to be tested, the PWM controller or the controller of the server system can send at least two third PWM signals to switch two of the at least two additional power stages to the On state and sending at least two fourth PWM signals to switch remaining power stages of the plurality of power stages to the Tri-state. The computer-implemented method for enabling the self-burn-in test of the PSD goes back to step 222. In an event that all power stages of the plurality of power stages have been tested, the computer-implemented method ends at step 234.

Terminologies

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks can be further interconnected by an intermediate network node, such as a router, to extend the effective "size" of each network.

Overlay networks generally allow virtual networks to be created and layered over a physical network infrastructure. Overlay network protocols, such as Virtual Extensible LAN (VXLAN), Network Virtualization using Generic Routing Encapsulation (NVGRE), Network Virtualization Overlays (NVO3), and Stateless Transport Tunneling (STT), provide a traffic encapsulation scheme which allows network traffic to be carried across L2 and L3 networks over a logical tunnel. Such logical tunnels can be originated and terminated through virtual tunnel end points (VTEPs).

Moreover, overlay networks can include virtual segments, such as VXLAN segments in a VXLAN overlay network, which can include virtual L2 and/or L3 overlay networks over which VMs communicate. The virtual segments can be identified through a virtual network identifier (VNI), such as a VXLAN network identifier, which can specifically identify an associated virtual segment or domain.

Network virtualization allows hardware and software resources to be combined in a virtual network. For example, network virtualization can allow multiple numbers of VMs to be attached to the physical network via respective virtual LANs (VLANs). The VMs can be grouped according to their respective VLAN, and can communicate with other VMs as well as other devices on the internal or external network.

Network segments, such as physical or virtual segments, networks, devices, ports, physical or logical links, and/or traffic in general can be grouped into a bridge or flood domain. A bridge domain or flood domain can represent a broadcast domain, such as an L2 broadcast domain. A bridge domain or flood domain can include a single subnet, but can also include multiple subnets. Moreover, a bridge domain can be associated with a bridge domain interface on a network device, such as a switch. A bridge domain interface can be a logical interface which supports traffic between an L2 bridged network and an L3 routed network. In addition, a bridge domain interface can support internet protocol (IP) termination, VPN termination, address resolution handling, MAC addressing, etc. Both bridge domains and bridge domain interfaces can be identified by a same index or identifier.

Furthermore, endpoint groups (EPGs) can be used in a network for mapping applications to the network. In particular, EPGs can use a grouping of application endpoints in a network to apply connectivity and policy to the group of applications. EPGs can act as a container for buckets or collections of applications, or application components, and tiers for implementing forwarding and policy logic. EPGs also allow separation of network policy, security, and forwarding from addressing by instead using logical application boundaries.

Cloud computing can also be provided in one or more networks to provide computing services using shared resources. Cloud computing can generally include Internet-based computing in which computing resources are dynamically provisioned and allocated to client or user computers or other devices on-demand, from a collection of resources available via the network (e.g., "the cloud"). Cloud computing resources, for example, can include any type of resource, such as computing, storage, and network devices, virtual machines (VMs), etc. For instance, resources can include service devices (firewalls, deep packet inspectors, traffic monitors, load balancers, etc.), compute/processing devices (servers, CPU's, memory, brute force processing capability), storage devices (e.g., network attached storages, storage area network devices), etc. In addition, such resources can be used to support virtual networks, virtual machines (VM), databases, applications (Apps), etc.

Cloud computing resources can include a "private cloud," a "public cloud," and/or a "hybrid cloud." A "hybrid cloud" can be a cloud infrastructure composed of two or more clouds that inter-operate or federate through technology. In essence, a hybrid cloud is an interaction between private and public clouds where a private cloud joins a public cloud and utilizes public cloud resources in a secure and scalable manner. Cloud computing resources can also be provisioned via virtual networks in an overlay network, such as a VXLAN.

Figure 3:
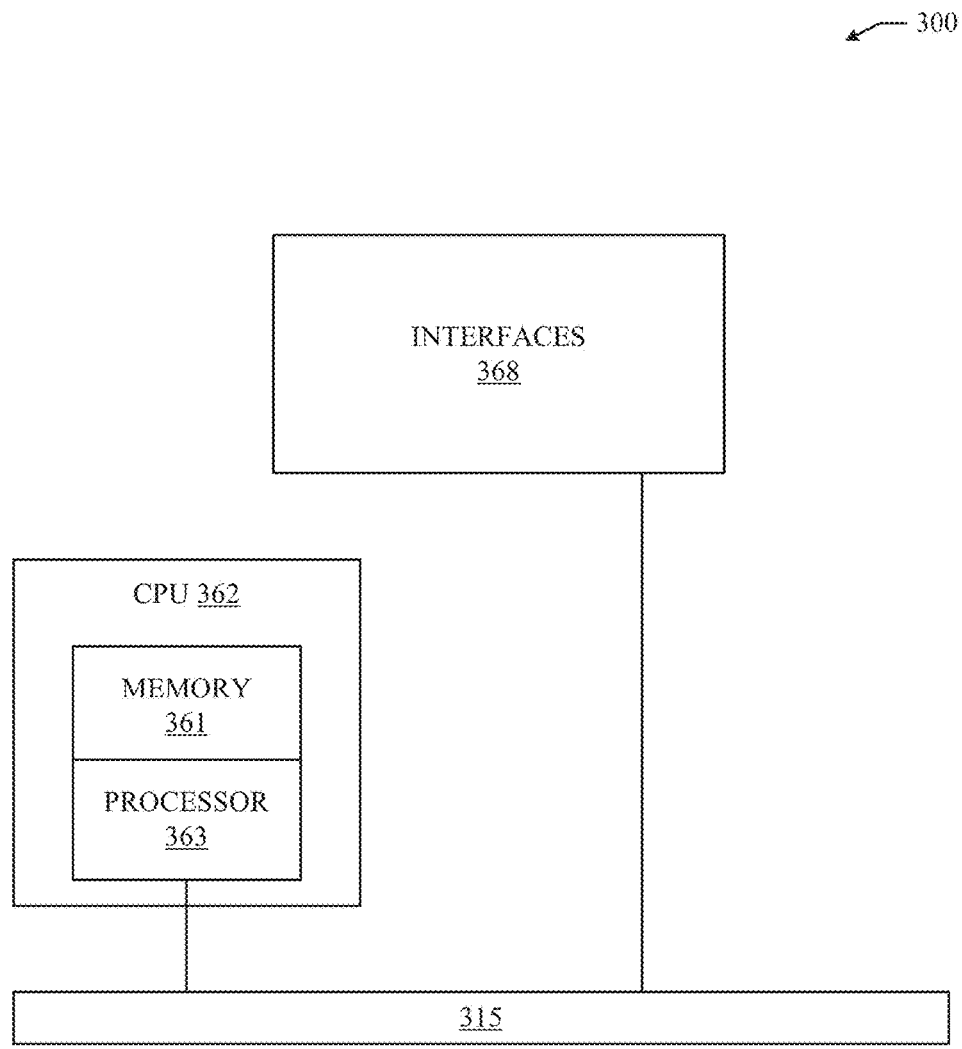
FIG. 3 illustrates an exemplary computing device in accordance with various implementations of the disclosure.
Figure 4:
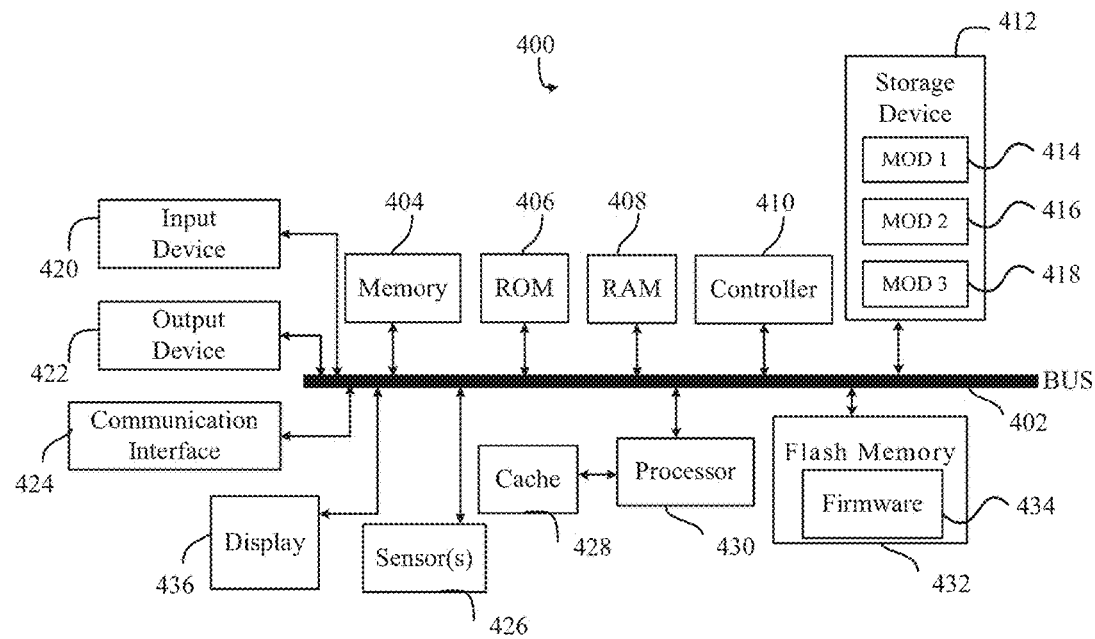
FIGS. 4 and 5 illustrate exemplary systems in accordance with various examples of the present disclosure.

In a network switch system, a lookup database can be maintained to keep track of routes between a number of end points attached to the switch system. However, end points can have various configurations and are associated with numerous tenants. These end-points can have various types of identifiers, e.g., IPv4, IPv6, or Layer-2. The lookup database has to be configured in different modes to handle different types of end-point identifiers. Some capacity of the lookup database is carved out to deal with different address types of incoming packets. Further, the lookup database on the network switch system is typically limited by 1K virtual routing and forwarding (VRFs). Therefore, an improved lookup algorithm is desired to handle various types of end-point identifiers. The disclosed technology addresses the need in the art for address lookups in a telecommunications network. Disclosed are systems, methods, and computer-readable storage media for unifying various types of end-point identifiers by mapping end-point identifiers to a uniform space and allowing different forms of lookups to be uniformly handled. A brief introductory description of example systems and networks, as illustrated in FIGS. 3 and 4, is disclosed herein. These variations shall be described herein as the various examples are set forth. The technology now turns to FIG. 3.

FIG. 3 illustrates an example computing device 300 suitable for implementing the present disclosure. Computing device 300 includes a master central processing unit (CPU) 362, interfaces 368, and a bus 315 (e.g., a PCI bus). When acting under the control of appropriate software or firmware, the CPU 362 is responsible for executing packet management, error detection, and/or routing functions, such as miscabling detection functions, for example. The CPU 362 preferably accomplishes all these functions under the control of software including an operating system and any appropriate applications software. CPU 362 can include one or more processors 363 such as a processor from the Motorola family of microprocessors or the MIPS family of microprocessors. In an alternative example, processor 363 is specially designed hardware for controlling the operations of the computing device 300. In a specific example, a memory 361 (such as non-volatile RAM and/or ROM) also forms part of CPU 362. However, there are many different ways in which memory could be coupled to the system.

The interfaces 368 are typically provided as interface cards (sometimes referred to as "line cards"). Generally, they control the sending and receiving of data packets over the network and sometimes support other peripherals used with the computing device 300. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 362 to efficiently perform routing computations, network diagnostics, security functions, etc.

Although the system shown in FIG. 3 is one specific computing device of the present disclosure, it is by no means the only network device architecture on which the present patent application can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 361) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 5:
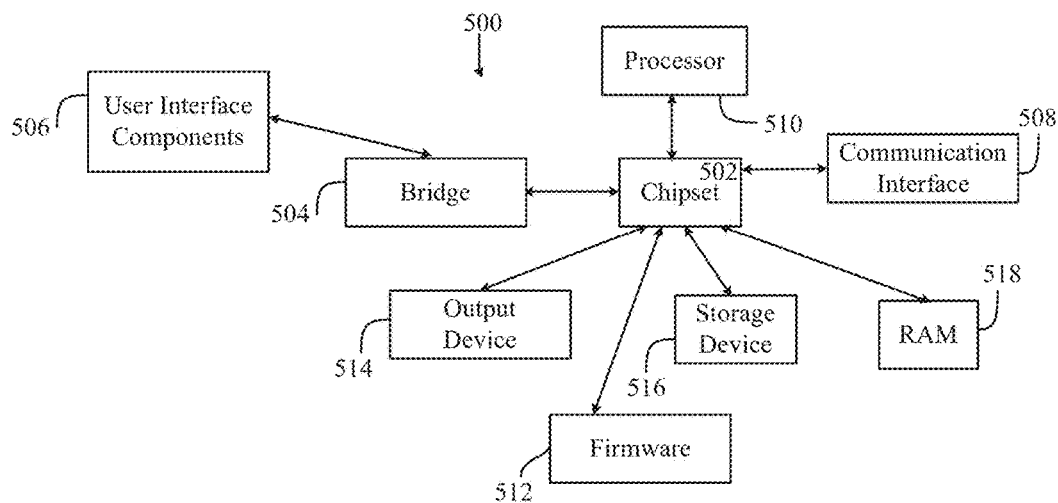

FIGS. 4 and 5 illustrate example system embodiments. The more appropriate embodiment will be apparent to those of ordinary skill in the art when practicing the present disclosure. Persons of ordinary skill in the art will also readily appreciate that other system embodiments are possible.

FIG. 4 illustrates a system bus computing system architecture 400 wherein the components of the system are in electrical communication with each other using a bus 402. Example system 400 includes a processing unit (CPU or processor) 430 and a system bus 402 that couples various system components including the system memory 404, such as read only memory (ROM) 406 and random access memory (RAM) 408, to the processor 430. The system 400 can include a cache of high-speed memory connected directly with, in close proximity to, or integrated as part of the processor 430. The system 400 can copy data from the memory 404 and/or the storage device 412 to the cache 428 for quick access by the processor 430. In this way, the cache can provide a performance boost that avoids processor 430 delays while waiting for data. These and other modules can control or be configured to control the processor 430 to perform various actions. Other system memory 404 may be available for use as well. The memory 404 can include multiple different types of memory with different performance characteristics. The processor 430 can include any general purpose processor and a hardware module or software module, such as module 1 414, module 2 416, and module 3 418 stored in storage device 412, configured to control the processor 430 as well as a special-purpose processor where software instructions are incorporated into the actual processor design. The processor 430 may essentially be a completely self-contained computing system, containing multiple cores or processors, a bus, memory controller, cache, etc. A multi-core processor may be symmetric or asymmetric.

To enable user interaction with the computing device 400, an input device 420 can represent any number of input mechanisms, such as a microphone for speech, a touch-sensitive screen for gesture or graphical input, keyboard, mouse, motion input, and so forth. An output device 422 can also be one or more of a number of output mechanisms known to those of skill in the art. In some instances, multimodal systems can enable a user to provide multiple types of input to communicate with the system 400. The communications interface 424 can generally govern and manage the user input and system output. There is no restriction on operating on any particular hardware arrangement and therefore the basic features here may easily be substituted for improved hardware or firmware arrangements as they are developed.

Storage device 412 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 408, read only memory (ROM) 406, and hybrids thereof.

The storage device 412 can include software modules 414, 416, 418 for controlling the processor 430. Other hardware or software modules are contemplated. The storage device 412 can be connected to the system bus 402. In one aspect, a hardware module that performs a particular function can include the software component stored in a computer-readable medium in connection with the necessary hardware components, such as the processor 430, bus 402, display 436, and so forth, to carry out the function.

The controller 410 can be a specialized microcontroller or processor on the system 400, such as a BMC (baseboard management controller). In some cases, the controller 410 can be part of an Intelligent Platform Management Interface (IPMI). Moreover, in some cases, the controller 410 can be embedded on a motherboard or main circuit board of the system 400. The controller 410 can manage the interface between system management software and platform hardware. The controller 410 can also communicate with various system devices and components (internal and/or external), such as controllers or peripheral components, as further described below.

The controller 410 can generate specific responses to notifications, alerts, and/or events and communicate with remote devices or components (e.g., electronic mail message, network message, etc.), generate an instruction or command for automatic hardware recovery procedures, etc. An administrator can also remotely communicate with the controller 410 to initiate or conduct specific hardware recovery procedures or operations, as further described below.

Different types of sensors (e.g., sensors 426) on the system 400 can report to the controller 410 on parameters such as cooling fan speeds, power status, operating system (OS) status, hardware status, and so forth. The controller 410 can also include a system event log controller and/or storage for managing and maintaining events, alerts, and notifications received by the controller 410. For example, the controller 410 or a system event log controller can receive alerts or notifications from one or more devices and components and maintain the alerts or notifications in a system event log storage component.

Flash memory 432 can be an electronic non-volatile computer storage medium or chip which can be used by the system 400 for storage and/or data transfer. The flash memory 432 can be electrically erased and/or reprogrammed. Flash memory 432 can include erasable programmable read-only memory (EPROM), electrically erasable programmable read-only memory (EEPROM), ROM, NVRAM, or complementary metal-oxide semiconductor (CMOS), for example. The flash memory 432 can store the firmware 434 executed by the system 400 when the system 400 is first powered on, along with a set of configurations specified for the firmware 434. The flash memory 432 can also store configurations used by the firmware 434.

The firmware 434 can include a Basic Input/Output System or its successors or equivalents, such as an Extensible Firmware Interface (EFI) or Unified Extensible Firmware Interface (UEFI). The firmware 434 can be loaded and executed as a sequence program each time the system 400 is started. The firmware 434 can recognize, initialize, and test hardware present in the system 400 based on the set of configurations. The firmware 434 can perform a self-test, such as a Power-on-Self-Test (POST), on the system 400. This self-test can test functionality of various hardware components such as hard disk drives, optical reading devices, cooling devices, memory modules, expansion cards and the like. The firmware 434 can address and allocate an area in the memory 404, ROM 406, RAM 408, and/or storage device 412, to store an operating system (OS). The firmware 434 can load a boot loader and/or OS, and give control of the system 400 to the OS.

The firmware 434 of the system 400 can include a firmware configuration that defines how the firmware 434 controls various hardware components in the system 400. The firmware configuration can determine the order in which the various hardware components in the system 400 are started. The firmware 434 can provide an interface, such as an UEFI, that allows a variety of different parameters to be set, which can be different from parameters in a firmware default configuration. For example, a user (e.g., an administrator) can use the firmware 434 to specify clock and bus speeds, define what peripherals are attached to the system 400, set monitoring of health (e.g., fan speeds and CPU temperature limits), and/or provide a variety of other parameters that affect overall performance and power usage of the system 400.

While firmware 434 is illustrated as being stored in the flash memory 432, one of ordinary skill in the art will readily recognize that the firmware 434 can be stored in other memory components, such as memory 404 or ROM 406, for example. However, firmware 434 is illustrated as being stored in the flash memory 432 as a non-limiting example for explanation purposes.

System 400 can include one or more sensors 426. The one or more sensors 426 can include, for example, one or more temperature sensors, thermal sensors, oxygen sensors, chemical sensors, noise sensors, heat sensors, current sensors, voltage detectors, air flow sensors, flow sensors, infrared thermometers, heat flux sensors, thermometers, pyrometers, etc. The one or more sensors 426 can communicate with the processor, cache 428, flash memory 432, communications interface 424, memory 404, ROM 406, RAM 408, controller 410, and storage device 412, via the bus 402, for example. The one or more sensors 426 can also communicate with other components in the system via one or more different means, such as inter-integrated circuit (I2C), general purpose output (GPO), and the like.

FIG. 5 illustrates an example computer system 500 having a chipset architecture that can be used in executing the described method(s) or operations, and generating and displaying a graphical user interface (GUI). Computer system 500 can include computer hardware, software, and firmware that can be used to implement the disclosed technology. System 500 can include a processor 510, representative of any number of physically and/or logically distinct resources capable of executing software, firmware, and hardware configured to perform identified computations. Processor 510 can communicate with a chipset 502 that can control input to and output from processor 510. In this example, chipset 502 outputs information to output device 514, such as a display, and can read and write information to storage device 516, which can include magnetic media, and solid state media, for example. Chipset 502 can also read data from and write data to RAM 518. A bridge 504 for interfacing with a variety of user interface components 506 can be provided for interfacing with chipset 502. Such user interface components 506 can include a keyboard, a microphone, touch detection and processing circuitry, a pointing device, such as a mouse, and so on. In general, inputs to system 500 can come from any of a variety of sources, machine generated and/or human generated.

Chipset 502 can also interface with one or more communication interfaces 508 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 510 analyzing data stored in storage 516 or 518. Further, the machine can receive inputs from a user via user interface components 506 and execute appropriate functions, such as browsing functions by interpreting these inputs using processor 510.

Moreover, chipset 502 can also communicate with firmware 512, which can be executed by the computer system 500 when powering on. The firmware 512 can recognize, initialize, and test hardware present in the computer system 500 based on a set of firmware configurations. The firmware 512 can perform a self-test, such as a POST, on the system 500. The self-test can test the functionality of the various hardware components 502-518. The firmware 512 can address and allocate an area in the memory 518 to store an OS. The firmware 512 can load a boot loader and/or OS, and give control of the system 500 to the OS. In some cases, the firmware 512 can communicate with the hardware components 502-510 and 514-518. Here, the firmware 512 can communicate with the hardware components 502-510 and 514-518 through the chipset 502 and/or through one or more other components. In some cases, the firmware 512 can communicate directly with the hardware components 502-510 and 514-518.

It can be appreciated that example systems 300, 400 and 500 can have more than one processor (e.g., 363, 430, 510) or be part of a group or cluster of computing devices networked together to provide greater processing capability.

For clarity of explanation, in some instances the present disclosure may be presented as including individual functional blocks including functional blocks including devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can include, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can include hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described herein.

Various aspects of the present disclosure provide systems and methods for enabling a self-burn-in test of a PSU of a server system in a datacenter. While specific examples have been cited above showing how the optional operation can be employed in different instructions, other examples can incorporate the optional operation into different instructions. For clarity of explanation, in some instances the present disclosure can be presented as including individual functional blocks including functional blocks including devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present patent application can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can include, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technologies can include hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response to requests from user devices, such as by executing one or more Web applications that can be implemented as one or more scripts or programs written in any programming language, such as Java®, C, C# or C++ or any scripting language, such as Perl, Python or TCL, as well as combinations thereof. The server(s) can also include database servers, including without limitation those commercially available from open market.

The server system can include a variety of data stores and other memory and storage media as discussed above. These can reside in a variety of locations, such as on a storage medium local to (and/or resident in) one or more of the computers or remote from any or all of the computers across the network. In a particular set of examples, the information can reside in a storage-area network (SAN) familiar to those skilled in the art. Similarly, any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present disclosure.

The specification and drawings are, accordingly, to be regarded in an illustrative rather than a restrictive sense. It will, however, be evident that various modifications and changes can be made thereunto without departing from the broader spirit and scope of the patent application as set forth in the claims.

What is claimed is:

1. A computer-implemented method for enabling a self-burn-in test of a power supply device (PSD) that comprises a modulation controller and a plurality of power stages, comprising:
    sending a first signal to switch a specific power stage of the plurality of power stages to an On state;
    sending at least one second signal to switch other power stage(s) of the plurality of power stages to a Tri-state, wherein the other power stage(s) functions as a load during a time period that the specific power stage is in the On state; and
    collecting output voltage, output current and temperature data from the specific power stage.

2. The computer-implemented method of claim 1, wherein each of the plurality of power stages comprises a driver, a high-side metal-oxide semiconductor field-effect transistor (MOSFET) and a low-side MOSFET, and wherein corresponding low-side MOSFET(s) of the other power stage(s) functions as the load during the time period that the specific power stage is in the On state.

3. The computer-implemented method of claim 1, wherein each of the plurality of power stages comprises a voltage sensing circuit, a current sensing circuit and a temperature sensor.

4. The computer-implemented method of claim 3, wherein collecting the output voltage, the output current and the temperature data comprises collecting the data from the voltage sensing circuit, the current sensing circuit, and the temperature sensor of the specific power stage.

5. The computer-implemented method of claim 4, furthering comprising:
    determining that the data fails a predetermined criterion; and
    generating a warning signal indicating that the PSD has failed the self-burn-in test.

6. The computer-implemented method of claim 5, wherein the predetermined criterion includes an output voltage range, an output current range, and a temperature range of the specific power stage.

7. The computer-implemented method of claim 4, furthering comprising:
    determining that the data has passed the predetermined criterion;
    determining that at least one additional power stage of the PSD is still to be tested;
    sending a third signal to switch one of the at least one additional power stage to the On state; and
    sending at least one fourth signal to switch remaining power stage(s) of the plurality of power stages to the Tri-state.

8. The computer-implemented method of claim 1, furthering comprising:
    receiving a test mode command from a baseboard management controller (BMC) via system management bus (SMBus), inter-integrated circuit ($I^2C$) bus, or power management bus (PMBus).

9. A system for enabling a self-burn-in test of a power supply device (PSD) that comprises a modulation controller and a plurality of power stages, comprising:
    a processor; and
    a computer-readable medium storing instructions that, when executed by the processor, cause the system to perform operations comprising:
        sending a first signal to switch a specific power stage of the plurality of power stages to an On state;
        sending at least one second signal to switch other power stage(s) of the plurality of power stages to a Tri-state, wherein the other power stage(s) functions as a load during a time period that the specific power stage is in the On state; and
        collecting output voltage, output current and temperature data from the specific power stage.

10. The system of claim 9, wherein each of the plurality of power stages comprises a driver, a high-side metal-oxide semiconductor field-effect transistor (MOSFET) and a low-side MOSFET, and wherein corresponding low-side MOSFET(s) of the other power stage(s) functions as the load during the time period that the specific power stage is in the On state.

11. The system of claim 9, wherein each of the plurality of power stages comprises a voltage sensing circuit, a current sensing circuit and a temperature sensor.

12. The system of claim 11, wherein collecting the output voltage, the output current and the temperature data comprises collecting the data from the voltage sensing circuit, the current sensing circuit, and the temperature sensor of the specific power stage.

13. The system of claim 12, wherein the instructions, when executed by the processor, cause the system to perform operations comprising:

determining that the data fails a predetermined criterion; and generating a warning signal indicating that the PSD has failed the self-burn-in test.

14. The system of claim 13, wherein the predetermined criterion includes an output voltage range, an output current range, and a temperature range of the specific power stage.

15. The system of claim 12, wherein the instructions, when executed by the processor, cause the system to perform operations comprising:
determining that the data has passed the predetermined criterion;
determining that at least one additional power stage of the PSD is still to be tested;
sending a third signal to switch one of the at least one additional power stage to the On state; and
sending at least one fourth signal to switch remaining power stage(s) of the plurality of power stages to the Tri-state.

16. The system of claim 9, wherein the instructions, when executed by the processor, cause the system to perform operations comprising:
receiving a test mode command from a baseboard management controller (BMC) of the system via SMBus, I²C bus, or PMBus.

17. A non-transitory computer-readable storage medium including instructions that, when executed by at least one processor of a system, cause the system to perform operations enabling a self-burn-in test of a power supply device (PSD) that comprises a modulation controller and a plurality of power stages, comprising:
sending a first signal to switch a specific power stage of the plurality of power stages to an On state;
sending at least one second signal to switch other power stage(s) of the plurality of power stages to a Tri-state, wherein the other power stage(s) functions as a load during a time period that the specific power stage is in the On state; and
collecting output voltage, output current and temperature data from the specific power stage.

18. The non-transitory computer-readable storage medium of claim 17, wherein each of the plurality of power stages comprises a voltage sensing circuit, a current sensing circuit and a temperature sensor, and wherein collecting the output voltage, the output current and the temperature data comprises collecting the data from the voltage sensing circuit, the current sensing circuit, and the temperature sensor of the specific power stage.

19. The non-transitory computer-readable storage medium of claim 18, wherein the instructions when executed further cause the system to perform operations comprising:
determining that the data fails a predetermined criterion; and
generating a warning signal indicating that the PSD has failed the self-burn-in test.

20. The non-transitory computer-readable storage medium of claim 18, wherein the instructions when executed further cause the system to perform operations comprising:
determining that the data has passed the predetermined criterion;
determining that at least one additional power stage of the PSD is still to be tested;
sending a third signal to switch one of the at least one additional power stage to the On state; and
sending at least one fourth signal to switch remaining power stage(s) of the plurality of power stages to the Tri-state.

* * * * *